United States Patent
Bertholom

(10) Patent No.: US 9,449,672 B2
(45) Date of Patent: Sep. 20, 2016

(54) DRAM MEMORY INTERFACE

(75) Inventor: Cedric Bertholom, Vinay (FR)

(73) Assignee: ST-Ericsson SA, Plan-les-Ouates (CH)

( * ) Notice: Subject to any disclaimer, the term of this patent is extended or adjusted under 35 U.S.C. 154(b) by 183 days.

(21) Appl. No.: 14/343,352

(22) PCT Filed: Sep. 6, 2012

(86) PCT No.: PCT/EP2012/067435
§ 371 (c)(1),
(2), (4) Date: Mar. 6, 2014

(87) PCT Pub. No.: WO2013/034650
PCT Pub. Date: Mar. 14, 2013

(65) Prior Publication Data
US 2014/0201436 A1   Jul. 17, 2014

(30) Foreign Application Priority Data

Sep. 8, 2011  (EP) .................................... 11368024
Feb. 16, 2012  (EP) .................................... 12305181

(51) Int. Cl.
| | | |
|---|---|---|
| G06F 13/00 | (2006.01) | |
| G06F 13/12 | (2006.01) | |
| G11C 11/406 | (2006.01) | |
| G11C 5/06 | (2006.01) | |
| G11C 7/02 | (2006.01) | |
| G11C 7/10 | (2006.01) | |
| G11C 11/4093 | (2006.01) | |
| G11C 11/402 | (2006.01) | |

(52) U.S. Cl.
CPC ......... *G11C 11/40615* (2013.01); *G11C 5/063* (2013.01); *G11C 7/02* (2013.01); *G11C 7/1048* (2013.01); *G11C 7/1057* (2013.01); *G11C 7/1084* (2013.01); *G11C 11/4023* (2013.01); *G11C 11/4093* (2013.01)

(58) Field of Classification Search
None
See application file for complete search history.

(56) References Cited

U.S. PATENT DOCUMENTS

| | | | |
|---|---|---|---|
| 5,731,711 A * | 3/1998 | Gabara | ............... H04L 25/0278 326/27 |
| 6,424,170 B1 | 7/2002 | Raman et al. | |
| 6,747,475 B2 | 6/2004 | Yuffe et al. | |
| 2006/0101167 A1 | 5/2006 | To et al. | |
| 2008/0177913 A1 | 7/2008 | Li | |

FOREIGN PATENT DOCUMENTS

| | | |
|---|---|---|
| EP | 0817441 A2 | 1/1998 |
| EP | 1335385 A2 | 8/2003 |

\* cited by examiner

*Primary Examiner* — David E Martinez
(74) *Attorney, Agent, or Firm* — Coats & Bennett, PLLC

(57) ABSTRACT

It is proposed a DRAM memory interface (40) for transmitting signals between a memory controller device (50) and a DRAM memory device (52). The DRAM memory interface comprises: data lines (44) for transmitting data signals; one or more control line(s) for transmitting control signals; one or more address line(s) for transmitting address signals; for each line, a transmitter device (41) connected to a first end of the line and a receiver device (42) connected to a second end of the line; wherein: each line is a single ended line wherein a signal transmitted on the line is referenced to a first reference voltage line (46); and—each line has an termination ($Z_1$, $Z_2$) on both the first and second ends of the line by connecting a first impedance ($Z_1$) to the first end of the line and a second impedance ($Z_2$) to the second end of the line.

16 Claims, 8 Drawing Sheets

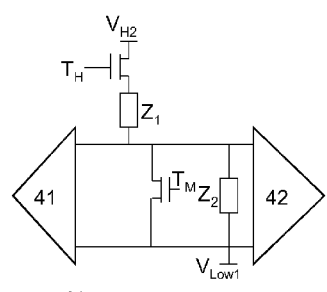
FIG. 6.1
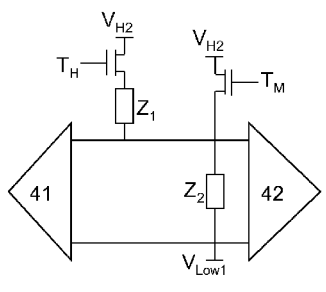
FIG. 6.4
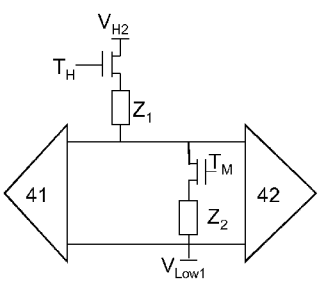
FIG. 6.7
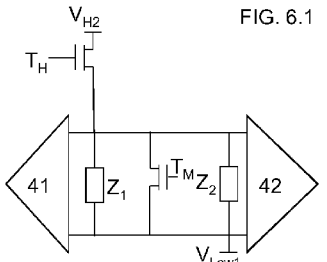
FIG. 6.2
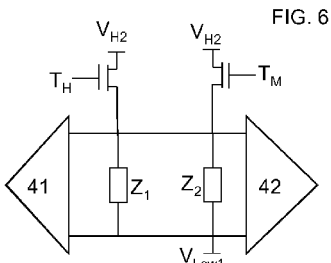
FIG. 6.5
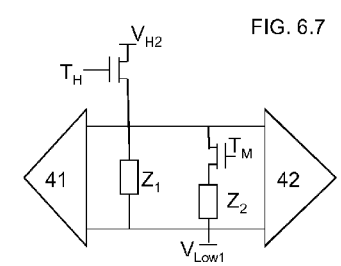
FIG. 6.8
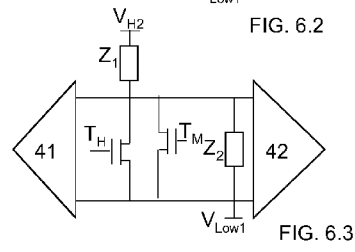
FIG. 6.3
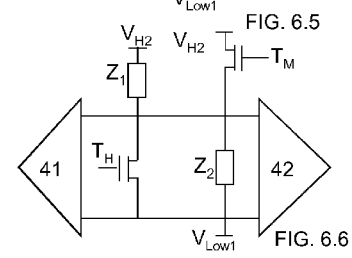
FIG. 6.6
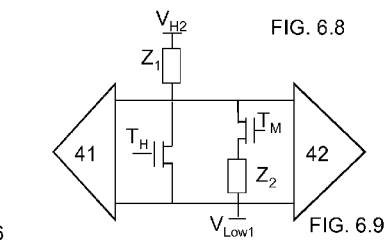
FIG. 6.9

| FIGURES | $T_H$ | $T_M$ | Signal swing range ('0' and '1') |
|---|---|---|---|
| 6.1 | ON | OFF | $V_{Low1}$ to $(V_{Hi2} - V_{Low1})/2$ |
| 6.2 | ON | OFF | $V_{Low1}$ to $V_{Hi2}$ |
| 6.3 | OFF | OFF | $(V_{Low1} + (V_{Hi2} - V_{Low1}) * Z_1/(Z_2 + Z_1)$ to $(V_{Hi2} - V_{Low1})/2$ |
| 6.4 | ON | ON | $V_{Low1}$ to $(V_{Hi2} - V_{Low1})/2$ |
| 6.5 | ON | ON | $V_{Low1}$ to $V_{Hi2}$ |
| 6.6 | OFF | ON | $(V_{Low1} + (V_{Hi2} - V_{Low1}) * Z_1/(Z_2 + Z_1)$ to $(V_{Hi2} - V_{Low1})/2$ |
| 6.7 | ON | ON | $V_{Low1}$ to $(V_{Hi2} - V_{Low1})/2$ |
| 6.8 | ON | ON | $V_{Low1}$ to $V_{Hi2}$ |
| 6.9 | OFF | ON | $(V_{Low1} + (V_{Hi2} - V_{Low1}) * Z_1/(Z_2 + Z_1)$ to $(V_{Hi2} - V_{Low1})/2$ |

FIG. 7

| FIGURES | $T_H$ | $T_M$ | Signal swing range ('0' and '1') |
|---|---|---|---|
| 6.1 | ON | OFF | $V_{Low1}$ to $(V_{Hi2} - V_{Low1})/2$ |
| 6.2 | ON | OFF |  |
| 6.3 | OFF | OFF | $V_{Low1}$ to $(V_{Hi2} - V_{Low1})/2$ |
| 6.4 | ON | ON | $(V_{Hi2} - V_{Low1})/2$ to $V_{Hi2}$ |
| 6.5 | ON | ON |  |
| 6.6 | OFF | ON | $(V_{Hi2} - V_{Low1})/2$ to $V_{Hi2}$ |
| 6.7 | ON | ON | $(V_{Hi2} - V_{Low1})/2$ to $V_{Hi2}$ |
| 6.8 | ON | ON | $(V_{Hi2} - V_{Low1})/2$ to $V_{Hi2}$ |
| 6.9 | OFF | ON | (Vhi-Vlow)/2 to (Vhi) |

FIG. 8

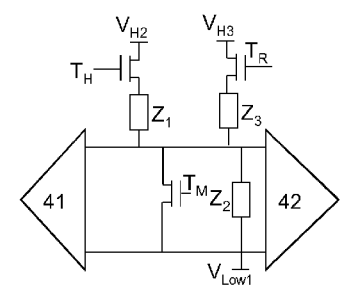
FIG. 9.1
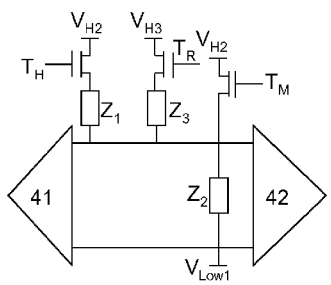
FIG. 9.4
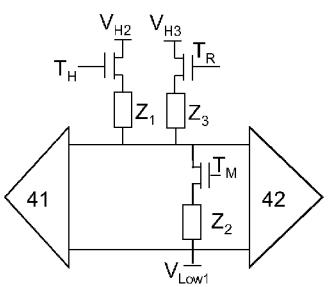
FIG. 9.7
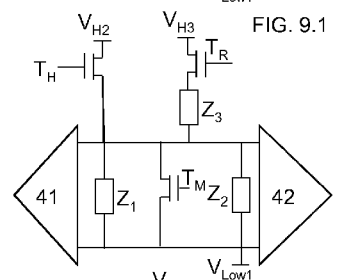
FIG. 9.2
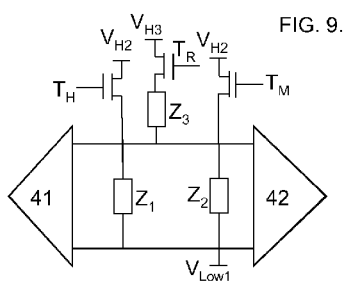
FIG. 9.5
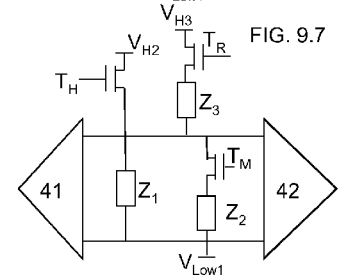
FIG. 9.8
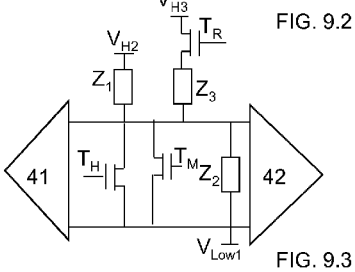
FIG. 9.3
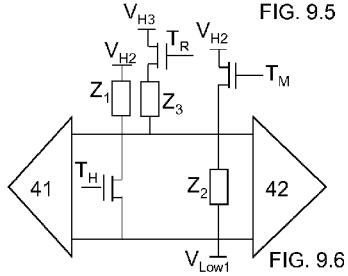
FIG. 9.6
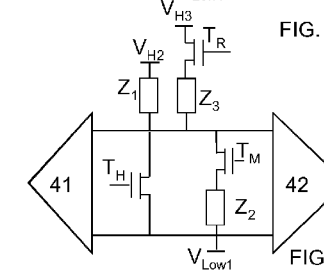
FIG. 9.9

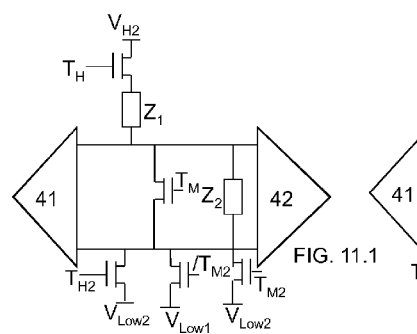
FIG. 11.1
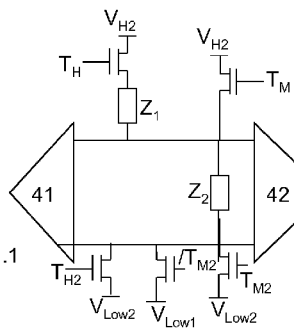
FIG. 11.4
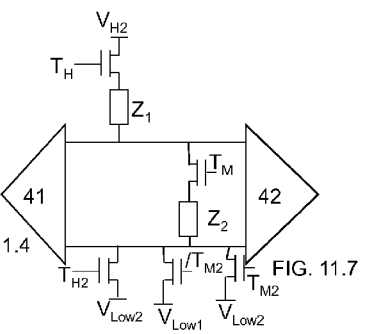
FIG. 11.7
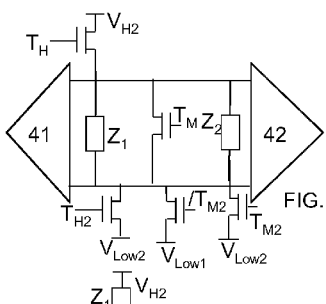
FIG. 11.2
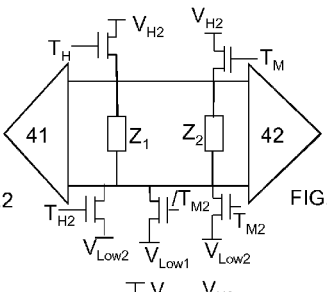
FIG. 11.5
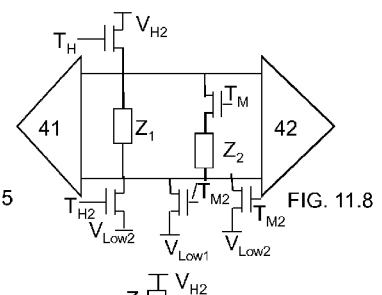
FIG. 11.8
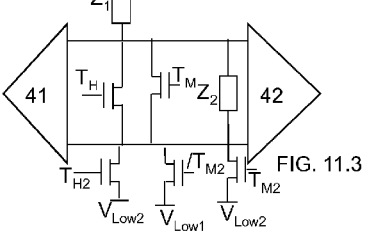
FIG. 11.3
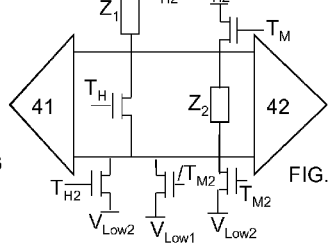
FIG. 11.6
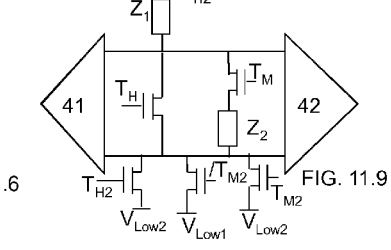
FIG. 11.9

| FIGURES | $T_H$ | $T_M$ | $T_{H2}$ | $T_{M2}$ | $/T_{M2}$ |
|---|---|---|---|---|---|
| 11.1 | ON | OFF | ON | OFF | OFF |
| 11.2 | ON | OFF | ON | OFF | OFF |
| 11.3 | OFF | OFF | ON | OFF | OFF |
| 11.4 | ON | ON | ON | OFF | OFF |
| 11.5 | ON | ON | ON | OFF | OFF |
| 11.6 | OFF | ON | ON | OFF | OFF |
| 11.7 | ON | ON | ON | OFF | OFF |
| 11.8 | ON | ON | ON | OFF | OFF |
| 11.9 | OFF | ON | ON | OFF | OFF |

FIG. 12

| FIGURES | $T_H$ | $T_M$ | $T_{H2}$ | $T_{M2}$ | $/T_{M2}$ |
|---|---|---|---|---|---|
| 11.1 | ON | OFF | ON | OFF | OFF |
| 11.2 | ON | OFF | ON | OFF | OFF |
| 11.3 | OFF | OFF | ON | OFF | OFF |
| 11.4 | ON | ON | ON | OFF | OFF |
| 11.5 | ON | ON | ON | OFF | OFF |
| 11.6 | OFF | ON | ON | OFF | OFF |
| 11.7 | ON | ON | ON | OFF | OFF |
| 11.8 | ON | ON | ON | OFF | OFF |
| 11.9 | OFF | ON | ON | OFF | OFF |

FIG. 13

DRAM MEMORY INTERFACE

TECHNICAL FIELD

The invention relates to the field of DRAM (Dynamic random-access) memory, especially to DRAM interfaces for transmitting data between a CPU/Host/Core and a DRAM memory device.

BACKGROUND ART

Up to now the Dynamic Random Memory (DRAM) interface uses a parallel link, as defined in several JDEC standards, e.g. JEDEC (Joint Electron Device Engineering Council) DDR1/DDR2/DDR3, JEDEC LPDDR1/LPDDR2, JEDEC GDDR3/GDDR4/GDDR5.

Memory interface (also referred to as memory bus) requires more and more bandwidth between a host (e.g. a processor) and the memory device. Indeed, as discussed in the United States Patent Application 2006/0136658, random access memory (RAM) plays a critical role in the operation of computing systems. The performance of computing systems and the software applications executed thereon depends on both the capacity and the speed of the RAM modules used. As software applications become more complex and work with larger amounts of data, RAM modules having both larger capacities and higher speeds are needed. While some improvement in performance can be attained by increasing the density and improving the quality of the memory integrated circuits used to make the RAM modules, new memory interface are required to meet the continually increasing demands of software applications.

It is illustrated in FIG. 1 a diagram showing forecasts of the needs for new DRAM interfaces with larger bandwidth.

Synchronous dynamic random access memory (SDRAM) has been developed to provide high performance memory modules. Among the different implementations of SDRAM, the JEDEC has established standards for double data rate (DDR), e.g. SDRAM, DDR2 SDRAM, DDR3 SDRAM, (low power double data rate) LPDDR SDRAM and LPDDR2 SDRAM. Referring to FIG. 3, it is shown a chronogram that represents a detailed schema of the functioning of a SDRAM memory.

DDR, DDR2, DDR3, LPDDR, LPDDR SDRAM are memory architectures which potentially double the rate of data transfers by utilizing both the rising and falling edges of each clock cycle for transferring data.

United States Patent Application 2006/0018178 discloses a schematic circuit block diagram (illustrated in FIG. 2) showing a prior art data communication circuit of a SDRAM. In FIG. 2, the prior data communication circuit 100 of the SDRAM comprises a plurality of control lines 110, such as /CS (Chip Select), /RAS (Row Address Strobe), /CAS (Column Address Strobe), /WE (Write Enable), and so on, for transmitting control signals to the SDRAM 102. The data communication circuit 100 also comprises address lines 120 and data lines 130. The address lines 120 transmit address signals from the data communication circuit 100 to the SDRAM 102. The data lines 130 transmit data from the data communication circuit 100 to the SDRAM 102. The data lines 130 of the data communication circuit 100 are coupled to the data pins, $Q_1$-$Q_N$, of the SDRAM 102. Generally, each of the data lines 130 of the data communication circuit 100 is coupled to each of the data pins, $Q_1$-$Q_N$, of the SDRAM 102, respectively. The number of the data lines 130 represents the width of the data bus of the data communication circuit 100. As well, the DRAM interface returns the path of data lines 130 to provide a bidirectional path.

However, it becomes difficult to double the highest defined bandwidth today with a full swing signal and not terminated path. Indeed, the increase of the bandwidth is in general performed by increasing the frequency at which the signals are transmitted, which consequently involves integrity problems for the transmitted signals. Consequently, signal integrity constrains the physical (PHY) layer, and therefore the package, and as a result, the development and material cost is increased. Furthermore, the increase of the bandwidth is also accompanied with an increase of the power consumption. Indeed, power consumption (and heat to be dissipated) increases with the speed, e.g. above 500 mW for latest LPDDR3 32 bit interface. This does not fit with low power system (e.g. mobile phone, laptop) wherein the electrical consumption and heat dissipation is critical.

Differential DRAM interface solutions double the pin number for the same data rate because these solutions rely on two separate wires for sending signals. As the DRAM interface returns the path, in differential mode, that feature (that is, DRAM interface returns the path) increases the design complexity of the PHY layer because the number of pins is doubled, and therefore increases the production costs. Moreover, these solutions further add latency in the transmission of signals.

In such high speed link, errors become frequent and so degrade bandwidth performances. In order to avoid these disadvantages, error correction have been introduced to recover from these errors, e.g. in GDDR5 (Graphics Double Data Rate) supported by JEDEC. The current GDDR5 interfaces use a side band pin to indicate the happening of error during the data transfer between two devices. Again, adding a new pin contributes to the increase of the production cost and PHY layer complexity.

Increasing the bandwidth of DRAM interface is therefore particularly power consuming and leads to degradation of the signal integrity. As energy saving is critical for electronic mobile communication devices and reduction of energy consumption of these devices is currently a major concern, there is therefore a need for a solution permitting to reduce the energy consumption of DRAM interface while increasing the bandwidth of the DRAM interface.

SUMMARY OF THE INVENTION

An object of embodiments of the present invention is to alleviate at least partly the above mentioned drawbacks. More particularly, embodiments of the invention aim at improving the way of reducing the energy consumption of DRAM interface while increasing the bandwidth of the DRAM interface. Especially, this invention takes places in DDR memory interfaces and describes a possible DRAM (DDR, LPDDR, GDDR) memory interface.

This is achieved with a DRAM memory interface for transmitting signals between a memory controller device and a DRAM memory device. The DRAM memory interface comprises:
- data lines for transmitting data signals;
- one or more control line(s) for transmitting control signals;
- one or more address line(s) for transmitting address signals;
- for each line, a transmitter device connected to a first end of the line and a receiver device connected to a second end of the line;

wherein:
  each line is a single ended line wherein a signal transmitted on the line is referenced to a first reference voltage line; and
  each line has an termination on both the first and second ends of the line by connecting a first impedance to the first end of the line and a second impedance to the second end of the line.

That each line is a single-ended line and is terminated on its ends has the effect that a signal can be transmitted with a very low swing: indeed, as the impedance of the line is fixed, the swing of the signal is automatically fixed for a given current because the impedance is defined as the ratio of the voltage by the current. Otherwise said, the swing of the signal can be lowered by fixing and lowering the impedance of the line. For instance, the swing of a signal may be scaled from 400 mVp down to 100 mVp or even lesser.

One advantage of this effect is that the speed of the signal transmission can be increased. Indeed, signal transitions which are used to represent information, require less time to be performed inasmuch as the change from a first voltage level to a second voltage level is smaller. Therefore, lowering the signal swing reduces the time required to perform electrical transition from a first voltage level to a second voltage level, and transition can consequently be performed more quickly.

Another advantage is that the reducing of the signal swing allows to reduce signal integrity issues.

Another advantage is that the decreasing of the signal swing allows to reduce the consumption of energy because the change from the first voltage level to the second voltage level is smaller.

Another advantage is that the single ended signaling scheme used for each line of the interface allows to reduce the number of pins, which therefore makes easier the design of the DRAM interface and decreases the production costs.

This is also achieved with a system comprising a memory controller device and a DRAM memory device that are connected to the DRAM memory interface of the invention. The DRAM memory device comprises:
  memory cells for storing data;
  a physical layer implementing receiver devices connectable to the second end of each line of the DRAM memory interface, wherein each receiver device implements the second impedance connected to the second end of the line and control the switching of the second transistor forced to act as an ON/OFF switch;
  a memory controller layer for maintaining a relation between control signals and/or address signals and the related data when the control lines and/or the one or more address line(s) respectively transmit the control signals and/or address signals by using a serial transmission.

The memory controller device comprises:
  a physical layer implementing transmitter devices connectable to the first end of each line of the DRAM memory interface, wherein each transmitter device implements the first impedance connected to the second end of the line and control the switching of the first transistor forced to act as an ON/OFF switch;
  one or more voltage supply for providing:
    the voltage of the first reference voltage line, if any;
    the second voltage reference of the second reference voltage line; and
    the third voltage reference of the third reference voltage line.

In another example, the interface may uses two or three lanes for Command and Address (CA) information, wherein the two or three lanes for Command and Address (CA) information transmit the Command and Address signals by using a serial transmission.

Alternatively, the interface may use 10 or more lanes for CA but at lower speed, e.g. by using parallel bus. CA data are sent at system clock by a parallel bus.

In an example, CPU/Host controller device transmits the system clock and the bit clock to the memory device. The system clock may work e.g. at 200 MHz or 266 MHz or a factor of them. A Data Q Strobe (DQS) bit clock is a factor of the system clock, e.g. a clock multiplier ×16 so that the frequencies may be 3.2 GHz or 4.2 GHz. It may be ×4 or ×8 or ×32 as well.

Still in an example, data and CA lines may use a Double Data Rate scheme, so a clock period delivers 2 data.

In another example, data lanes provide information at 6.4 Gbps or 8.5 Gbps or a factor of them, wherein the data lanes for transmit the data signals by using a serial transmission.

In an example, the first, second and third impedances are respectively a fixed or adjustable resistance with a value from 10 Ohm to few hundred of Ohm.

In another example, the termination at each end of a line is an on-die termination.

BRIEF DESCRIPTION OF THE DRAWINGS

FIG. 6 shows illustrations of embodiments of the DRAM memory interface.

FIG. 7 shows the states of the first $T_H$ and second $T_M$ transistors of FIG. 6 when transmission of a signal occurs from the transmitter of the memory controller device to the receiver of the DRAM memory device.

FIG. 8 shows the states of the first $T_H$ and second $T_M$ transistors of FIG. 6 when transmitting a signal from the transmitter of the DRAM memory device to the receiver of the memory controller device.

FIG. 9 shows embodiments of the DRAM memory interface with duplex transmission capacity.

FIG. 11 shows embodiments of the DRAM memory interface with duplex transmission capacity.

FIG. 12 illustrates the states of the transistors of FIG. 11 when the transmission of a signal occurs from memory controller device to DRAM memory device.

FIG. 13 illustrates the states of the transistors of FIG. 11 when the transmission of a signal occurs from the transmitter of the DRAM memory device to the receiver of the memory controller device.

DETAILED DESCRIPTION OF EMBODIMENTS OF THE INVENTION

Figure 5:
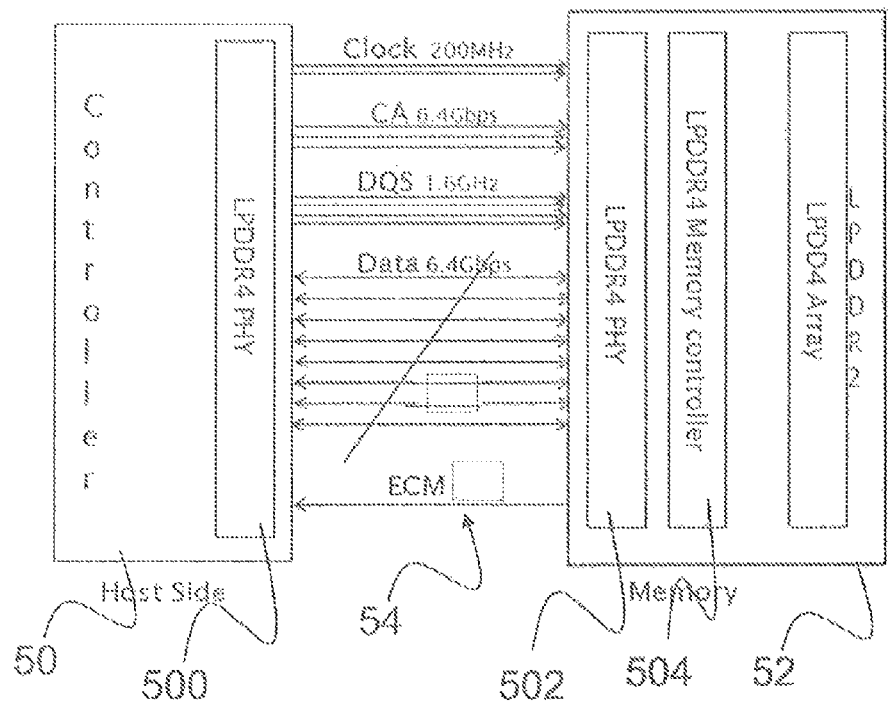
FIG. 5 illustrates a schematic circuit block diagram showing data transmission between a host side such as a memory controller device and a DRAM memory device.

Referring to FIG. 5, it is shown an illustration of a schematic circuit block diagram showing data transmission between a CPU/host side and a memory. Especially, FIG. 5 shows an example of a DRAM memory interface 54 for transmitting signals between a memory controller device 50 and a DRAM memory device 52. The term memory interface refers to the means for allowing interactions between components and how these interactions are performed. A DRAM memory interface is thus hardware that allows a memory controller device and a DRAM memory device to communicate; the DRAM memory interface works as an input/output system between the memory and its controller.

The CPU/host, or memory controller device, may be, but is not limited to, a piece of hardware dedicated to the management of the memory. The memory controller device may be also a CPU (Computer Processing Unit), or at least managed by the CPU. The memory controller device may also be a computer program executable by hardware (e.g. a processing unit such as the CPU).

The DRAM (dynamic random-access memory) memory device may be a random-access memory that stores each bit of data in a separate capacitor within an integrated circuit.

The DRAM memory interface may comprise one or more clock lines for transmitting clock signal of the memory controller. The clock signal may be provided by the memory controller device. In practice, the one or more clock lines are unidirectional (as opposed to bi-directional). The clock system may work as, but not limited to, e.g. 200 MHZ or 266 MHZ or a factor of these frequencies.

The DRAM memory interface comprises one or more control lines for transmitting control signals. The one or more control lines may be used for transmitting command to the DRAM memory device. For instance, the one or more control lines may be used for transmitting write or read command, or for indicating which chip on the memory is to be selected.

The DRAM memory interface comprises one or more address line(s) for transmitting address signals. The address refers to the location on the memory (that is, on one memory chip) of the data to be written or read. The address may comprise a row address and column address.

The DRAM memory interface further comprises data lines for transmitting data from or to the DRAM memory device. It is to be understood that the data lines are bidirectional. Alternatively, the DRAM memory interface may comprise one data line. In practice, the DRAM memory interface may be composed of 8, 16 or 32 lanes (or even more), data lines.

The DRAM memory interface may comprise at least one ECM (Error Control Management) line for transmitting from the DRAM memory device to the memory controller device signal relative to errors detected on the memory side, e.g. receiving of corrupted data.

Each line 54 of the DRAM memory interface may be connected to at least one transmitter device and one receiver device: a first end of the line is connected to the transmitter device and the second end of the line is connected to the receiver device.

In the case of a bi-directional line, e.g. a data line, the first end of a line is connected to both a transmitter and a receiver, and the second end of a line is also connected to both a transmitter and a receiver. Otherwise said, each line comprises two ends and each end of a line is connected to a pair of transmitter/receiver.

Both the DRAM memory device 52 and the memory controller device 50 may comprise respectively a physical (PHY) layer 502, 500 that implements a receiver and/or transmitter devices that allow connecting the line to the devices. The transmitter can be also referred to as a driver. The receiver and the transmitter may form an on-die termination.

The DRAM memory device 52 may comprise a memory controller layer 504 for maintaining a relation between control signals and/or address signals.

Each line of the DRAM memory interface is a single ended line, a signal transmitted on the line being referenced to a first reference voltage line. Otherwise said, for each line, the line carries a varying voltage that represents the signal to be transmitted, while the first reference voltage line provides a first reference voltage and allows the transmission of a return current.

Each line may have its own first reference voltage line. Alternatively, the first reference voltage line may be common for at least two lines. In practice, the first reference voltage line is common for all the lines of the DRAM memory interface. This advantageously allows reducing the number of lines, and therefore the number of pins required; this facilitates the design of the bus and reduces the manufacturing costs.

The first reference voltage line provides a first reference voltage $V_{Low1}$. The first reference voltage may be connected to a voltage supply providing the first reference voltage or connected to the ground. The voltage supply may be the CPU/host or memory controller device.

Each line of the DRAM memory interface has a termination on both the first and second ends of the line. In other words, the two ends of a line are terminated or have a terminator. A terminated line is a transmission line with impedance connected across the conductors at the far end. As these impedances match the characteristic impedance of the line, no signals will be reflected from the far end to distort information transmissions, and this on the both ends of the line. The quality transmission of signals is therefore improved. This advantageously allows to reduce the signal swing. The signal swing is the peak-to-peak voltage range of the signal transmitted on the line. The termination is performed by connecting a first impedance $Z_1$ to the first end of the line and a second impedance $Z_2$ to the second end of the line.

That the lines are single ended lines and terminated allows transmitting a signal one a line with a very low swing because the signal is not disturb by noises on the line: indeed, reflections of a signal arriving at an end of the line are avoided. Therefore, a signal can be transmitted on the line with a reduced signal swing because the performances of the line are improved. Consequently, the speed of the transmission of signals on the line is increased because the transitions for a first voltage level to a second voltage level is reduced, and therefore requires less time. In addition, a reduced signal swing further allows reducing current consumption as less current is required for voltage transitions. Hence, the bandwidth is increased while the power consumption is decreased.

Typically, the impedances $Z_1$ and $Z_2$ may be resistances with a fixed or adjustable resistance with a value from 10 Ohm to few hundred of Ohm, e.g. 50 Ohm.

In practice, the impedance values of the first $Z_1$ and second $Z_2$ impedances may be identical. For instance, the two impedances $Z_1$ and $Z_2$ may be resistances, e.g. with a value of 50 Ohm. Because the values of the first $Z_1$ and second $Z_2$ impedances are identical, the line is a balanced line; a transmission line consisting of two conductors of the same type, each of which have equal impedances along their lengths and equal impedances to the first reference voltage line. This advantageously provides lines having good rejection of external noise. Consequently, this contributes to allow a further reduction of the signal swing. Again, this contributes to increasing the bandwidth whereas the power consumption is decreased.

Because the lines are terminated lines on both ends and single-ended, the impedance of the lines is fixed. Thus, the swing of the signal (that is, the peak-to-peak voltage range of the signal) is fixed for a given current because the impedance is defined as the ratio of the voltage by the current. Otherwise said, the swing of the signal is lowered because the impedance of the line can be fixed. For instance, the swing of a signal may be scaled from 400 mVp down to 100 mVp or even lesser.

Figure 1:
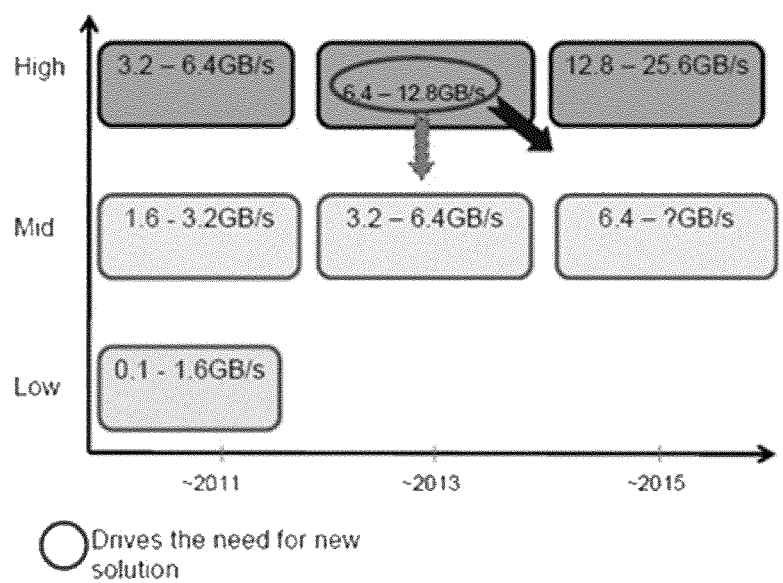
FIG. 1 illustrates a diagram illustrative of the needs for new solutions.
Figure 2:
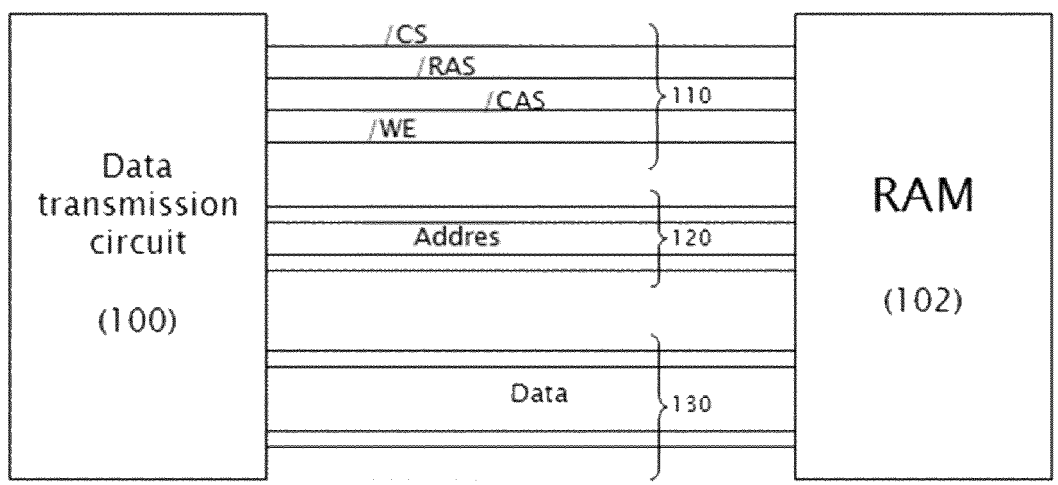
FIG. 2 illustrates a schematic circuit block diagram showing a data circuit.
Figure 3:
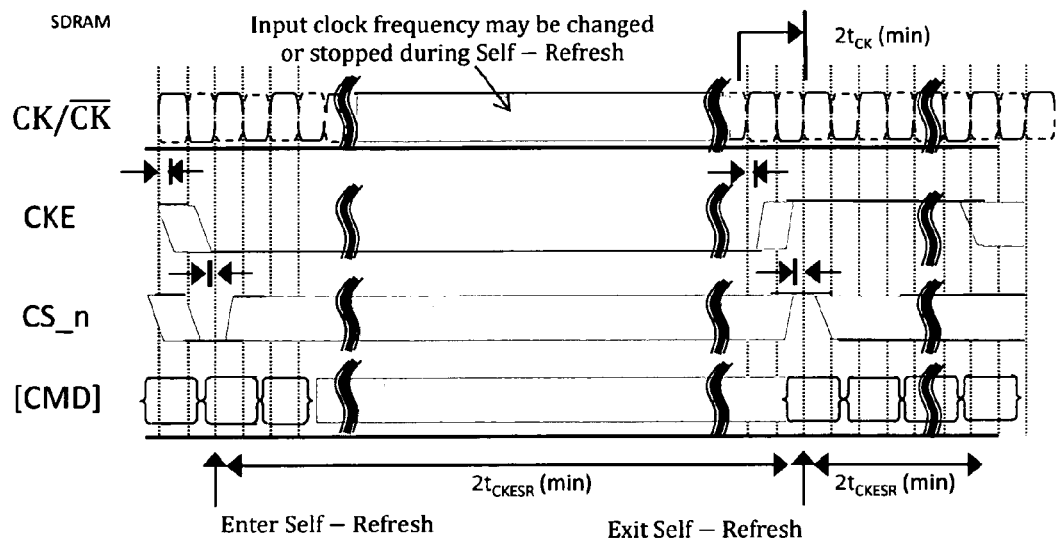
FIG. 3 is an illustrative flowchart.
Figure 4:
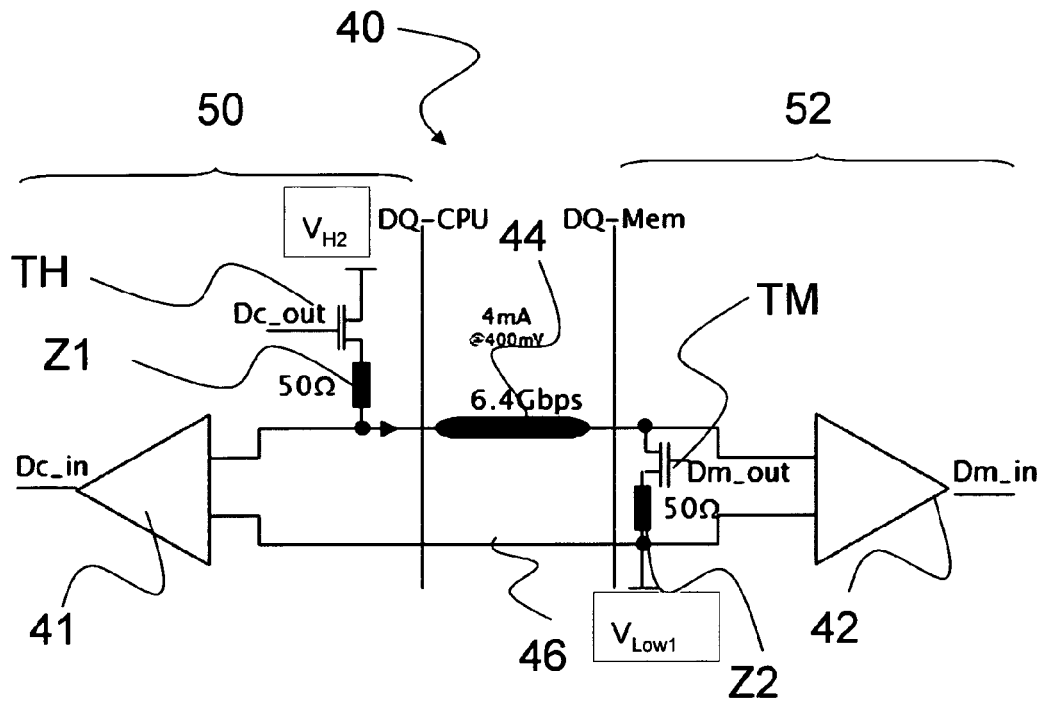
FIG. 4 is an illustration of an embodiment of the DRAM memory interface.

Referring now to FIG. 4, it is shown an illustration of an embodiment of a DRAM memory interface. The DRAM memory interface comprises a line 44 that is connected on its first end to a transmitter 41 and on its second end to receiver 42. The line 44 is single ended: a signal transmitted on the line is referenced to a first reference voltage line 46. The line 44 is further terminated on both ends: two impedances (here represented by two resistances) are connected to the line 44. The line is a balanced one as the two resistances have the same value, e.g. 50 Ohms.

In this embodiment, the first reference voltage line is connected to a power supply provided by the memory controller device 50, and the power supply provides a first reference voltage $V_{Low1}$.

The first end of the line (that is, the end connected to the memory controller device) is connected to a second reference voltage line providing a second voltage reference $V_{H2}$. When a first signal is to be transmitted from the memory controller device 50 to the DRAM memory device 52, the signal swing of this first signal is a function of the voltage difference between the voltage $V_{H2}$ of the second reference voltage line and the voltage $V_{Low1}$ of the first reference voltage line 46.

The second impedance $Z_2$ is connected to the first reference voltage line 46 through a serial circuit comprising a second transistor $T_M$ forced to act as an ON/OFF switch. The second transistor $T_M$ may be controlled by the receiver, e.g. on the memory side. Alternatively, in the case of a bi-directional line, the second transistor $T_M$ may be controlled by a transmitter of a pair of transmitter/receiver connected on the second end of a line, that is, on memory side.

The one or more control line(s) and/or the one or more address line(s) may transmit the control signals and/or address signals by using a serial transmission. The serial transmission (also referred to as serial communication) is the process of sending data one bit at a time, sequentially, over the line. Thus, instead of transmitting one Byte per clock cycle using eight lines as with parallel transmission, one control or address line transmits one Byte per clock cycle using one single line. In other words, a serial control or address line transmits a single stream of data (also referred to as Byte stream) per clock cycle.

Using serial transmissions on the control or address line advantageously allows the lines to be clocked at a higher rate. Indeed, a clock skew phenomenon that may appear between different lines is not an issue. In addition, serial transmission allows reducing the number of line, which reduces the number of pins. Consequently, the design of the DRAM memory interface is made easier and the manufacturing costs are further decreased. Moreover, the electromagnetic interferences such as crosstalk is less of an issue when using serial transmission, because there are fewer lines in proximity. Thus, signal integrity is more preserved, and less errors appears when transmitting data. In addition, as fewer lines are required for transmitting control or address signal, it is therefore possible to increase the number of data lines, which in turn increases the bandwidth of the DRAM memory interface.

In practice, the data lines may transfer data using serial transmission. In the event serial transmissions on the control and/or address lines are used, relation between Byte streams of the data line and Bytes streams of the control and/or address lines may be maintained in order to ensure that the DRAM memory device knows which operation to perform on which Byte stream of data. Maintaining the relation between data signals and control and/or address signals may be performed by a memory controller layer. For instance, in FIG. 5, the memory controller layer 504 is implemented on the DRAM memory device. The memory controller layer may control the PHY layer of the DRAM memory device, and in particular the receivers (and transmitter, if any) of the DRAM memory device.

Referring back to FIG. 4, the second reference voltage line is connected to the line 44 through a serial circuit comprising a first transistor $T_H$ forced to act as an ON/OFF switch and the first impedance $Z_1$. The first transistor $T_H$ is forced to ON when the first signal is to be transmitted, while the second transistor $T_M$ is forced to ON when the first signal is transmitted. In the configuration shown in FIG. 4, the resistances $Z_1$, $Z_2$ and the lines 44, 42 act as a voltage divider (also known as a potential divider). The swing signal of the first signal is therefore comprises between $(V_{Hi2}-V_{Low1})/2$ and $V_{Low1}$. Otherwise said, the DRAM memory interface is low swing, using a voltage level defined by $V_{Hi2}$, $V_{Low1}$ and terminations (the resistances $Z_1$ and $Z_2$). This swing is e.g. below 400 mV (like 200 mv, 100 mv or lower). In addition, the lines are terminated both side, either to ground, or to $V_{Low1}$ or to $V_{Hi2}$.

The connection of the second reference voltage line to the line may be toggled so that data are toggling at the output of the memory controller device (e.g. CPU/host) transmitter.

Hence, the encoding of the data to be transmitted may be a voltage $(V_{Hi2}-V_{Low1})/2$ for transmitting '1' and $(V_{Low1})$ for transmitting '0'. It is to be understood that the choice of the encoding is purely conventional and may be inverted: $(V_{Hi2}-V_{Low1})/2$ for transmitting '0' and $(V_{Low1})$ for transmitting '1'. In other words, data are toggling at the output of the CPU/host transmitter (e.g. the driver) between $(V_{Hi2}-V_{Low1})/2$ and $(V_{Low1})$.

The representation made in FIG. 4 of the DRAM memory interface is provided for illustrative purpose, that is, one or more components of the DRAM memory interface may be comprised in either the DRAM memory device or the memory controller. For instance, and in reference to FIG. 5, the physical layer 502 implementing the receiver device 42 connectable to the second end of the line 44 may implement the second impedance $Z_2$ connected to the second end of the line and may implement and/or control the switching of the second transistor $T_M$. Similarly, the physical layer 500 implementing the transmitter device 41 connected to the first end of the line 44 may implement the first impedance $Z_1$ connected to the first end of the line and may implement and/or control the switching of the first transistor $T_H$.

The voltage $V_{Low1}$ of the first reference voltage line 46 and the voltage $V_{Hi2}$ of the second reference voltage line 44 may be provided by the memory controller device 50, e.g. a CPU. It is to be noticed that the voltage of the voltage $V_{Hi2}$ is larger than the voltage $V_{Low1}$. Moreover, the voltage $V_{Low1}$ (which is the lower reference voltage) may be common to CPU/Host and the DRAM memory device. Furthermore, as mentioned previously, the voltage $V_{Low1}$ (lower reference voltage) may be shared among several CA, DQ and data lines: at the minimum, there may be is one $V_{Low1}$ for two lines (e.g. CAIDQ lines) and at the maximum, there may be one $V_{Low1}$ per complete DRAM memory interface.

In practice, the quality of the first reference voltage line providing $V_{Low1}$ has a good channel quality, which advantageously improves signal integrity. The good channel quality may comprise low impedance (roughly ~1 Ohm or less) of the first reference voltage line, or minimized impedance break.

Referring now to FIG. 6, it is shown illustrations of embodiments (FIGS. 6.1 to 6.9) of a DRAM memory interface of the invention. These embodiments are equivalent to the one depicted on FIG. 4. It is noticeable that FIG. 6.7 is identical to the DRAM memory interface depicted on FIG. 4.

The embodiments (excepted for the one depicted on FIG. 6.7) differ from the one depicted on FIG. 6.7 in (i) how the first end of the line (that is, the end connected to the memory controller device) is connected to the second reference voltage line providing a second voltage reference VH2 and (ii) how the transmission of a return current created by the transmitted first signal is forced to the second impedance connected to the second end of the line (that is, on the memory side). Arrangements of (i) and (ii) are depicted.

In embodiments depicted on FIGS. 6.1 to 6.3, the second reference voltage line providing a second voltage reference $V_{H2}$ is connected to the first reference voltage line in a similar way as in FIG. 6.7, and in FIGS. 6.7 to 6.9, the second impedance is connected to the line and to the first reference voltage line through a serial circuit comprising a second transistor $T_M$ forced to act as an ON/OFF switch in a similar way as in FIG. 6.7.

Referring now to FIG. 6.1, this embodiment differs from the one depicted on FIG. 4 in that, on the DRAM memory device's side, the second impedance $Z_2$ does not have a serial connection with the second transistor $T_M$, but is connected in parallel with the second transistor ($T_M$) forced to act as an ON/OFF switch. In other words, both the second impedance $Z_2$ and the second transistor $T_M$ are connected to the second end of the line and the first reference voltage line. In this embodiment, the second transistor $T_M$ is forced to OFF when the first signal is transmitted so that the current is forced to the second impedance $Z_2$.

Referring now to FIG. 6.4, this embodiment differs from the one depicted on FIG. 4 in that, on the DRAM memory device's side, the second impedance $Z_2$ is connected to the first reference voltage line and the second reference voltage line is connected to the second end of the line through a second transistor $T_M$ forced to act as an ON/OFF switch. The second transistor $T_M$ is forced to ON when the first signal is transmitted so that the current is forced to the second impedance $Z_2$.

Referring now to FIG. 6.8, this embodiment differs from the one depicted on FIG. 4 in that, on the memory controller device's side, the first impedance $Z_1$ is placed between the first reference voltage line and the line, and the second reference voltage line is connected to the line through the first transistor $T_H$ forced to act as an ON/OFF switch. When the first signal is to be transmitted, the first transistor $T_H$ is forced to ON and the second transistor $T_M$ is forced to ON so that the current is forced to the second impedance $Z_2$.

Referring now to FIG. 6.9, this embodiment differs from the one depicted on FIG. 4 in that, on the memory controller device's side, the second reference voltage line is connected to the line through the first impedance $Z_1$, and the first transistor $T_H$ acting as an ON/OFF switch is connected between the first end of the line and the first reference voltage line. When the first signal is to be transmitted, the first transistor $T_H$ is forced to OFF and the second transistor $T_M$ is forced to ON so that the current is forced to the second impedance $Z_2$.

FIGS. 6.2 to 6.3 and FIGS. 6.5 to 6.6 depict the remaining combinations of the arrangements on the memory's side and controller's side.

In FIG. 6, the CPU/Host provides reference voltage $V_{Low1}$ which is lower than $V_{H2}$. This signal $V_{Low1}$ is used as voltage reference by all CPU/Host and memory receiver. This signal keeps its impedance characteristics optimized (very low, few unit of Ohm or less than 1 Ohm) to ensure a sufficient signal integrity. $V_{Low1}$ can be designed per line, or a couple of lines or a multiple lines.

When CPU/Host is transmitting (that is, when the transmitter on the memory side is emitting), the transistor $T_M$ is forced to OFF for the embodiments depicted on FIGS. 6.1 to 6.6, and the transistor $T_M$ is forced to ON for the embodiments depicted on FIGS. 6.7 to 6.9. Memory driver disable its driver transistor (off) for or on for FIGS. 6.7 to 6.9.

In the embodiments of FIGS. 6.1, 6.4, and 6.7, the encoding of the data to be transmitted may be a voltage $(V_{Hi2}-V_{Low1})/2$ for transmitting '1' and $(V_{Low1})$ for transmitting '0'. As previously discussed in reference to FIG. 4, the choice of the encoding is purely conventional and may be inverted.

In the embodiments of FIGS. 6.2, 6.5, and 6.8, the encoding of the data to be transmitted may be a voltage $V_{Hi2}$ for transmitting '1' and $(V_{Low1})$ for transmitting '0'. Similarly, the choice of the encoding is purely conventional and may be inverted.

In the embodiments of FIGS. 6.3, 6.6, and 6.9, the encoding of the data to be transmitted may be a voltage $(V_{Hi2}-V_{Low1})/2$ for transmitting '1' and $(V_{Low1}+(V_{Hi2}-V_{Low1})*Z_1/(Z_2+Z_1))$ for transmitting '0'. Similarly, the choice of the encoding is purely conventional and may be inverted.

Referring now to FIG. 7, it is shown a table summarizing the state of the first $T_H$ and second $T_M$ transistors when transmission of a signal occurs from the transmitter of the memory controller device to the receiver of the DRAM memory device. The range of swing signal is further shown.

Referring now to FIG. 8, it is shown a table summarizing the state of the first $T_H$ and second $T_M$ transistors when transmitting a signal from the transmitter of the DRAM memory device to the receiver of the memory controller device. The DRAM memory device transmits signal by shortcut the line (or not) with the first reference voltage line (embodiments of FIGS. 6.1 to 6.3 and FIGS. 6.7 to 6.9) or with the second voltage reference line (embodiments of FIGS. 6.4 to 6.6). During the transmission of the DRAM memory device, the memory controller device maintains second voltage reference $V_{Hi2}$ of the second reference voltage line to the line.

It is to be understood that the first transistor $T_H$ is controlled by the receiver of the memory controller device and the second transistor $T_M$ is controlled by the transmitter of the DRAM memory device Referring now to FIG. 9, it is shown the embodiments of FIG. 6 on which the second end of the line (that is, on the DRAM memory device's side) is further connected to a third reference voltage line providing a third voltage reference $V_{H3}$. FIG. 9 comprises FIGS. 9.1 to 9.9. This third voltage reference $V_{H3}$ may be chosen so that the third voltage reference $V_{Hi3}$ is larger than the second voltage reference $V_{H2}$.

In practice, the third reference voltage line is connected to the second end of the line through a third transistor $T_R$ forced to act as an ON/OFF switch.

When the DRAM memory devices wishes to transmits data to the memory controller device, the third transistor $T_R$ is switched to ON so that a second signal is generated on the line. The third voltage reference $V_{Hi3}$ is therefore used for reverse transmission. The third transistor $T_R$ may be controlled by the transmitter of the pair of receiver/transmitter connected to the second end of the line, the line being a bidirectional line.

During the reverse transmission, that is, when the third voltage reference $V_{Hi3}$ is applied on the line, the second transistor $T_H$ is switched for insuring that the second voltage reference $V_{Hi2}$ is maintained on the line. The transmitter device connected to the first end of the line (that is, the memory controller device's side) may implement and/or control the switching of the first transistor $T_H$.

Typically, during the reverse transmission, the CPU/host (that is, the memory controller device) may enable the first transistor $T_H$ to ON for the embodiments depicted on FIGS. 6.1 to 6.2 and FIGS. 6.4 to 6.8, or off for the embodiments depicted on FIGS. 6.3, 6.6, and 6.9. In other terms, CPU/Host maintains the line at $V_{Hi2}$ voltage level.

In practice, the third voltage reference $V_{Hi3}$ is chosen so that the third voltage reference $V_{Hi3}$ is larger than the second voltage reference $V_{Hi2}$. In addition, the frequency of the second signal sent using the third voltage reference $V_{Hi3}$ may be smaller that the frequency of the first signal transmitted from the memory controller device to the DRAM memory device. Typically, the ratio between the frequency of the first signal and frequency of the second signal is equal or larger than 2.

When a second signal is transmitted on the line by the DRAM memory device, the memory controller detects a voltage increase of the voltage on the line. In particular, the DRAM memory device may emit while the opposite end of the line, that is, on the memory controller side, is emitting as well. As a result, there is a contention on the line: swing of the first signal emitted by the memory controller device's side is increased. This means that the receiver of the memory controller device samples a value which is different of what is transmitting. This allows to generate an alert signal by the PHY layer of the memory controller device, and this alert signal may be transmitted to an upper layer of the memory controller device. This alert signal may indicate that both devices are emitted together on the same time on the same line. For instance, this alert signal can be understood as an error from the upper layer of the memory controller device. Advantageously, the DRAM memory interface may indicate to the memory controller device that a transmission error occurred, with a minimized latency. Then, the first signal may be reemitted by the memory controller device. Thus, the detection of contention on the line and error detection is improved. As another advantage, the single-ended scheme is preserved, and there is no need to add a dedicated pin for transmission of detected error. Again, manufacturing costs are decreased and the whole design if the DRAM memory interface is simpler.

It is to be understood that the reverse transmission described above may be applied in the opposite case wherein the DRAM memory device is emitting a second signal by applying the third voltage reference $V_{Hi3}$ on the line. The memory controller device may wish to inform the DRAM memory device that an error occurred during transmission. To this aim, the memory controller device forces transistor $T_H$ to ON so that the second voltage reference $V_{Hi2}$ is applied on the line. The second voltage reference $V_{Hi2}$ is chosen larger than the third voltage reference $V_{Hi3}$. In addition, the frequency of the first signal sent using the third voltage reference $V_{Hi2}$ may be smaller that the frequency of the first signal transmitted from the memory controller device to the DRAM memory device. Typically, the ratio between the frequency of the second signal and frequency of the first signal is equal or larger than 2. When a first signal is transmitted on the line by the memory controller device, the DRAM memory device detects a voltage increase of the voltage on the line.

Interestingly, the third voltage reference $V_{Hi3}$ may be also used for transmitting a second signal from the DRAM memory device to the memory controller while the memory controller device is emitting a first signal, thus providing a full duplex line. Said otherwise, both ends of the line, namely the first and second ends of the line, are transmitting at the same time and their respective receiver interprets data of their opposite transmitter.

Figure 10:
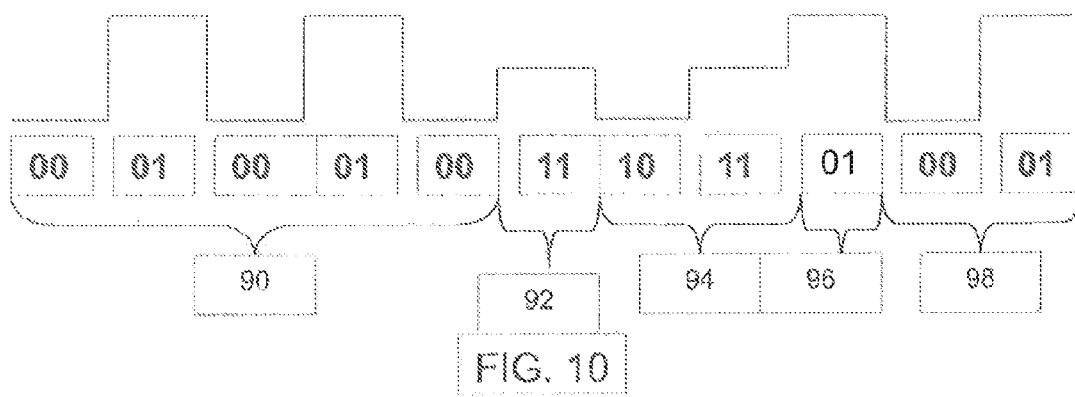
FIG. 10 shows a chronogram depicting the interpretations of the signals received at the receiver of the memory controller device with the DRAM memory interface of FIGS. 9 and 11.

Referring now to FIG. 10, it shown a chronogram depicting the interpretations of the signals received at the receiver of the memory controller device. On the first part 90 of the chronogram, the activity detected by the receiver corresponds to a simplex activity: information is transmitted from the memory controller device to the DRAM memory device. Voltages values observed by the receiver thus amount to symbols '00' (for the lowest voltage value) and '01' (for the highest voltage value). In the second part 92 of the chronogram, the DRAM memory device starts emitting on the line. The receiver detects an intermediary voltage value. At this step, the receiver is now aware that the DRAM memory device has started to emit, and therefore, interprets the intermediate voltage value as '11' on part 92. The symbol '11' thus amounts to a signal that the duplex transmission is enabled on the line. From this point, the receiver now interprets the voltage values received as being related to full duplex transmissions. For instance, in the third part 94 of the chronogram, the lowest voltage value amounts to the symbol '10' and the intermediate voltage value as symbol '11'. Then, on the fourth part 96, the DRAM memory device stops emitting. The voltage value detected corresponds to the symbol '01'. The receiver is thus aware that the full duplex transmission is stopped. In the part 98, the transmission is thus a simplex transmission and the voltage values are interpreted as in the part 90.

Referring now to FIG. 11, it is shown illustrations (FIGS. 11.1 to 11.9) of embodiments of a DRAM memory interface according to the invention. These embodiments are equivalent in effects to those depicted on FIG. 9, but they differ in that the transmission of the second signal relies on a third voltage reference $V_{Low2}$ that is chosen smaller than the second voltage reference $V_{Hi2}$ and larger than the first reference voltage $V_{Low1}$ of the first reference voltage line. Alternatively, the transmission of the second signal may rely on a third voltage reference $V_{Low2}$ that is chosen smaller than the second voltage reference $V_{Hi2}$ and smaller than the first reference voltage $V_{Low1}$ of the first reference voltage line.

In the embodiments of FIG. 11, the first reference voltage line is connected either to the first reference voltage $V_{Low1}$ or the third voltage reference $V_{Low2}$. To this aim, the first end of the first reference voltage line (that is, the part of the first reference voltage line which is located on the memory controller device's side) is further connectable to a third reference voltage line providing the third voltage reference $V_{Low2}$. In practice, the third reference voltage line is connected to the second end of the first reference voltage line through a third transistor $T_{H2}$ forced to act as an ON/OFF switch. The third transistor $T_{H2}$, as well as the first transistor $T_{H1}$, is controlled by the receiver of the pair of receiver/transmitter of the device wishing to emit a signal.

The second end of the first reference line (that is, the part of the first reference voltage line which is located on the DRAM memory device's side) is further connectable to the third reference voltage line providing the third voltage reference $V_{Low2}$. In practice, the third reference voltage line may be connected to the second end of the first reference voltage line through a fourth transistor $T_{M2}$ forced to act as an ON/OFF switch. Furthermore, the second end of the first reference line may be also connectable to the first reference voltage $V_{Low1}$ through a fifth transistor $/T_{M2}$ forced to act as an ON/OFF switch. The fifth transistor $/T_{M2}$ is the inverse of the fourth transistor $T_{M2}$. This means that when the fifth transistor $/T_{M2}$ is OFF, the fourth transistor $T_{M2}$ is ON, and inversely. The fourth $T_{M2}$ and fifth $/T_{M2}$ transistors, as well as the second transistor $T_M$, are controlled by the receiver of the pair of receiver/transmitter of the device wishing to emit a signal.

Principles of operations in simplex mode of the DRAM memory interface of the embodiments illustrated on FIG. 11 are similar to those discussed in reference to FIG. 6, excepted that the first reference voltage line is connectable to either the first reference voltage $V_{Low1}$ or the third voltage reference $V_{Low2}$.

Referring now to FIG. 12, it is shown the states of the transistors when the transmission of a signal occurs from the transmitter of the memory controller device to the receiver of the DRAM memory device in the event the first reference voltage line is connected to the first reference voltage $V_{Low1}$.

Referring now to FIG. 13, it is shown the states of the transistors when the transmission of a signal occurs from the transmitter of the DRAM memory device to the receiver of the memory controller device in the event the first reference voltage line is connected to the first reference voltage $V_{Low1}$.

It is to be understood that in the event the first reference voltage line is connected to the third reference voltage $V_{Low2}$, the third transistor $T_{H2}$ and/or the fourth transistor $T_{M2}$ are forced to ON, the fifth transistor $/T_{M2}$ being forced to OFF.

Principles of operations in duplex mode of the DRAM memory interface of the embodiments illustrated on FIG. 11 are now discussed.

When the transmission of a first signal occurs from the transmitter of memory controller device to the receiver of the DRAM memory device, the transmitter of the DRAM memory device may wish to send a second signal while the first signal is emitted. To this aim, the DRAM memory device toggles the fourth $T_{M2}$ and fifth $/T_{M2}$ transistors according to the data to transmit to the memory controller device. The second $T_M$ and third $T_{H2}$ transistors are forced OFF. The memory controller device thus detects a voltage increase of the line from $V_{Low1}$ to $V_{Low2}$ depending the fourth $T_{M2}$ transistor is ON or OFF.

When the transmission of a first signal occurs from DRAM memory device to the receiver of the transmitter of memory controller device, the transmitter of memory controller device may wish to send a second signal while the first signal is emitted. To this aim, the memory controller device toggles the third transistor $T_{H2}$ according to the data to transmit to the memory controller device. Meanwhile, the first transistor $T_H$ is forced to ON and the fourth transistor $T_{M2}$ is forced to OFF, which involves that the fifth transistor $/T_{M2}$ is forced to ON. The receiver of the DRAM memory device thus detects a voltage increase of its output data to $V_{Low2}$.

The preferred embodiment of the present invention has been described. It will be understood that various modifications may be made without departing from the spirit and scope of the invention. Therefore, other implementations are within the scope of the following claims. For instance, receivers may be always on, or for power consideration, they can be switch off.

The invention claimed is:

1. A DRAM memory interface for transmitting signals between a memory controller device and a DRAM memory device, the DRAM memory interface comprising:
   data lines for transmitting data signals;
   one or more control lines for transmitting control signals;
   one or more address lines for transmitting address signals;
   for each line, a transmitter device connected to a first end of the line and a receiver device connected to a second end of the line;
   wherein each line is a single ended line wherein a signal transmitted on the line is referenced to a first reference voltage line;
   wherein at the first end of the line a first impedance and a first transistor selectively connect the line to a second reference voltage line higher than the first reference voltage line, whereby actuation of the transistor is operative to transmit a signal by driving the line between two digital states represented by voltage levels; and
   wherein at the second end of the line a second impedance is connected between the line and the first reference voltage line, and wherein return current flows through the second impedance when a signal is transmitted on the line.

2. The DRAM memory interface of claim 1, wherein the impedance values of the first and second impedances are identical.

3. The DRAM memory interface of claim 1, wherein the first reference voltage line is connected to a first reference voltage or ground.

4. The DRAM memory interface of claim 1, wherein the first reference voltage line is common for at least two lines.

5. The DRAM memory interface of claim 1, wherein the one or more control lines transmit the control signals or the one or more address lines transmit the address signals by using a serial transmission.

6. The DRAM memory interface of claim 1, wherein, for each line:
   the second reference voltage line is connected to the line through a serial circuit comprising the first transistor forced to act as an ON/OFF switch and the first impedance; and
   the first transistor is forced to ON when the first signal is to be transmitted.

7. The DRAM memory interface of claim 1, wherein, for each line:
   the second reference voltage line is connected to the line through the first transistor forced to act as an ON/OFF switch;
   the first impedance is further connected to the first reference voltage line; and
   the first transistor is forced to ON when the first signal is to be transmitted.

8. The DRAM memory interface of claim 1, wherein, for each line:
   the second reference voltage line is connected to the line through the first impedance;

the first transistor forced to act as an ON/OFF switch is connected between the first end of the line and the first reference voltage line; and the first transistor is forced to OFF when the first signal is to be transmitted.

9. The DRAM memory interface of claim 1, wherein, for each line:
the second impedance is further connected to the first reference voltage line through a serial circuit comprising a second transistor forced to act as an ON/OFF switch; and
the second transistor is forced to ON when the first signal is transmitted.

10. The DRAM memory interface of claim 1, wherein:
the second impedance is further connected to the first reference voltage line;
a second transistor forced to act as an ON/OFF switch is connected between the second end of the line and the first reference voltage line; and
the second transistor is forced to OFF when the first signal is transmitted.

11. The DRAM memory interface of claim 1, wherein:
the second impedance is further connected to the first reference voltage line;
the second reference voltage line is connected to the second end of the line through a second transistor forced to act as an ON/OFF switch; and
the second transistor is forced to ON when the first signal is transmitted.

12. The DRAM memory interface of claim 1, wherein, for each data line:
the second end of the line is further connected to a third reference voltage line providing a third voltage reference, the third voltage reference being larger than the second voltage reference; and
a second transistor is switched for insuring that the second voltage reference is maintained on the line.

13. The DRAM memory interface of claim 12, wherein, for each data line:
a first circuit driving a voltage onto the line at the first end thereof but detecting a voltage on the line different from that being driven, concludes that a second circuit is driving a signal onto the line at the second end, and generates contention error.

14. The DRAM memory interface of claim 12, wherein, for each data line:
full duplex transmission is supported by detecting three voltage levels on the line, wherein transitions between a lowest voltage level and a highest voltage level are interpreted as first and second symbols, and wherein, after an intermediate voltage level is detected, transitions between the lowest voltage level and the intermediate voltage level are interpreted as third and fourth symbols.

15. A system, comprising:
a DRAM memory interface comprising:
data lines for transmitting data signals;
one or more control lines for transmitting control signals;
one or more address lines for transmitting address signals;
for each line, a transmitter device connected to a first end of the line and a receiver device connected to a second end of the line;
wherein each line is a single ended line wherein a signal transmitted on the line is referenced to a first reference voltage line; and
wherein at the first end of the line a first impedance and a first transistor selectively connect the line to a second reference voltage line higher than the first reference voltage line, whereby actuation of the transistor is operative to transmit a signal by driving the line between two digital states represented by voltage levels; and
wherein at the second end of the line a second impedance is connected between the line and the first reference voltage line, and wherein return current flows through the second impedance when a signal is transmitted on the line;
a DRAM memory device comprising:
memory cells for storing data;
a physical layer implementing receiver devices connectable to the second end of each line of the DRAM memory interface, wherein each receiver device implements the second impedance connected to the second end of the line; and
a memory controller layer for maintaining a relation between control signals and/or address signals and the related data signal when the control lines and/or the one or more address lines respectively transmit the control signals and/or address signals by using a serial transmission; and
a memory controller device comprising:
a physical layer implementing transmitter devices connectable to the first end of each line of the DRAM memory interface, wherein each transmitter device implements the first impedance connected to the first end of the line and control the switching of the first transistor forced to act as an ON/OFF switch; and
one or more voltage supply for providing:
the voltage of the first reference voltage line, if any.

16. The system of claim 15, wherein:
the impedance value of the first impedance implemented by each transmitter of the memory controller device and the impedance value of at least the second impedance implemented by each receiver of the DRAM memory device are identical; and
the first reference voltage line is common for all the lines of the DRAM memory interface.

* * * * *